United States Patent [19]

Liporace et al.

[11] Patent Number: 5,166,856
[45] Date of Patent: Nov. 24, 1992

[54] ELECTROSTATIC CHUCK WITH DIAMOND COATING

[75] Inventors: James W. Liporace, Wallkill; James A. Seirmarco, Buchanan, both of N.Y.

[73] Assignee: International Business Machines Corporation, Armonk, N.Y.

[21] Appl. No.: 648,681

[22] Filed: Jan. 31, 1991

[51] Int. Cl.$^5$ ............................................. H02N 13/00
[52] U.S. Cl. ......................................... 361/233; 269/8; 269/903; 279/128; 361/232
[58] Field of Search ................. 361/230, 233, 234; 269/8, 903; 29/829; 279/1 M; 278/1 M, 128

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 4,502,094 | 2/1985 | Lewin et al. | 361/234 |
| 4,554,611 | 11/1985 | Lewin | 361/234 |
| 4,645,218 | 2/1987 | Ooshio et al. | 279/1 M |
| 4,665,463 | 5/1987 | Ward et al. | 361/234 |
| 4,724,510 | 2/1988 | Wicker et al. | 361/234 |
| 4,831,212 | 5/1989 | Ogata et al. | 174/52.4 |
| 4,962,836 | 10/1990 | Martin | 192/58 B |
| 5,055,964 | 10/1991 | Logan et al. | 361/234 |

*Primary Examiner*—Jeffrey A. Gaffin
*Attorney, Agent, or Firm*—Jeffrey L. Brandt; Harold Huberfeld

[57] ABSTRACT

An electrostatic chuck includes a body of refractory metal, preferably molybdenum, sized to support a semiconductor wafer. A first layer of diamond having a thickness in the range of 0.1-5.0 microns coats the refractory metal body. A pair of generally planar electrodes, preferably formed by molybdenum, are disposed on the first layer of diamond. A second layer of diamond, of like thickness as the first layer, conformally coats the pair of electrodes. A dc voltage applied across the pair of electrodes develops an electrostatic force to hold the wafer against the second diamond layer.

37 Claims, 1 Drawing Sheet

ELECTROSTATIC CHUCK WITH DIAMOND COATING

RELATED APPLICATION

This application is related to U.S. patent application Ser. No. 579,439 filed 7 Sep. 1990 and assigned to the present assignee.

FIELD OF THE INVENTION

The present invention relates generally to semiconductor device processing and more particularly to an electrostatic chuck for holding semiconductor wafers in various processing environments.

BACKGROUND OF THE INVENTION

In the processing and manufacturing of semiconductor devices, it is necessary to hold semiconductor wafers in various orientations in different processing environments. Such wafers typically comprise silicon, gallium arsenide, or similar materials, and have a diameter in the range of 57–300 mm and a thickness in the range of 0.3–0.5 mm. Exemplary processing environments include: photolithographic exposure chambers; high-temperature, high-vacuum epitaxial growth chambers; and highly reactive, corrosive etching chambers.

Several different types of mechanisms, typically referred to as "chucks," are known for holding such wafers in these environments. A first type, a mechanical chuck, uses a mechanical arm or clamp to hold a wafer against a supportive body. Such mechanical chucks are disadvantageous in that the arm or clamp mechanism covers a portion of the wafer, blocking that wafer portion from the desired processing. Further, such a mechanical chuck can produce undesirable flexing or warping of the wafer.

Another type of holding apparatus is a vacuum chuck. Such a chuck uses a perforated surface, behind which a vacuum is formed, to hold a wafer against the surface. Vacuum chucks have the disadvantage of being unable to function in vacuum environments, such as may be found in an epitaxial growth chamber or etching tool.

A third type of holding apparatus is an electrostatic chuck. An electrostatic chuck uses an electrostatic field developed between the wafer and the chuck to hold the wafer against the chuck. Electrostatic chucks are generally desirable in that they operate in a vacuum environment. Further, they provide a uniform holding force, tending to inhibit wafer warpage.

The current state of the art with respect to electrostatic chucks does, however, leave much room for improvement. More specifically, such chucks require the use of relatively complex conductor/insulator structures. Such structures are expensive to manufacture and have a tendency to delaminate in harsh temperature or corrosive environments. Further, the holding power of such chucks is relatively weak, requiring the use of high voltages to establish an adequate electrostatic force. The use of high voltages produces a risk of arcing, which may cause damage to the wafer or the tool.

In the formation of electrostatic chucks, many different types of electrode configurations have been developed for improving holding forces. In the simplest configuration, the electrostatic force can be established by varying the potential between a single electrode and the wafer (a single pole electrostatic chuck). In more complex configurations, the electrostatic force is developed by establishing an electrical potential between two closely spaced, planar electrodes disposed parallel to the wafer (a dual pole electrostatic chuck).

U.S. Pat. No. 4,384,918 to Abe illustrates several different types of electrode configurations. As discussed above, despite the improvements accorded by some electrode configurations, the holding force developed by known electrostatic chucks is still relatively weak.

Various materials have been used to construct electrostatic chucks, the electrodes themselves typically comprising a copper or aluminum metal layer. Insulators typically include organic resins such as polyimide, inorganic insulators such as silicon nitride, and/or ceramics such as alumina or carbon.

U.S. Pat. No. 4,645,218 to Ooshio et al. is illustrative of the materials typically used to construct an electrostatic chuck. The chuck shown in Ooshio et al. includes a copper electrode 2 insulated by organic resin 4, 5, and supported by an aluminum body 1. A ceramic coverplate 8 surrounds the wafer A. As discussed above, such materials are prone to delamination in harsh environments.

OBJECTS OF THE INVENTION

An object of the present invention is to provide a new and improved electrostatic chuck for supporting a wafer.

Another object of the present invention is to provide such a chuck from materials not prone to delamination in harsh temperature or corrosive chemical environments.

A further object of the present invention is to provide such a chuck capable of providing strong holding forces by the application of relatively low voltage potentials.

Yet another object of the present invention is to provide such a chuck which is relatively inexpensive and straight-forward to manufacture.

SUMMARY OF THE INVENTION

In accordance with the present invention, there is provided an electrostatic chuck for supporting a wafer, comprising a conductive body; a layer of diamond coating at least a portion of the conductive body; and means for developing an electrostatic force to hold the wafer against the layer of diamond.

In accordance with another aspect of the present invention, there is provided a method of forming an electrostatic chuck for supporting a wafer, comprising the steps of providing a conductive body; forming a layer of diamond over at least a portion of the conductive body; and developing an electrostatic force to hold the wafer against the layer of diamond.

BRIEF DESCRIPTION OF THE DRAWINGS

These and other objects, features, and advantages of the present invention will be clear from a consideration of the detailed description of the invention, in conjunction with the drawing Figures, in which.

DETAILED DESCRIPTION OF THE INVENTION

Figure 1:
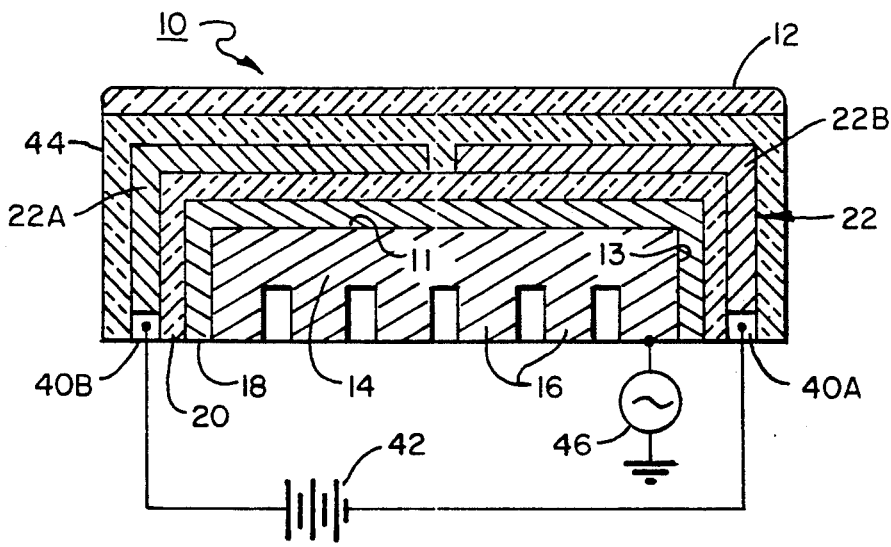
FIG. 1 is a cross-sectional view of an electrostatic chuck mechanism constructed in accordance with the present invention.

Referring now to FIG. 1, a cross-sectional view of a generally cylindrical electrostatic chuck 10 is shown supporting a semiconductor wafer 12. Chuck 10 has, for example, a diameter D of 300 mm for supporting wafer 12 of like diameter.

Chuck 10 includes a body 14 of conductive material, preferably a refractory metal, and preferably molybdenum. Body 14 defines a substantially planar upper surface 11, and a cylindrical sidewall 13. Body 14 is preferably at least 99.95% pure molybdenum, comprising less than 100 parts-per-million (ppm) boron contaminants. Body 14 has a diameter of approximately wafer 12, and a thickness of about 10-25 millimeters. Cooling fins 16 are included on the bottom of body 14 to assist in air or liquid (not shown) cooling.

It will be appreciated that, for purposes of illustrating and describing the present invention, the layers on body 14, described below, have been drawn enlarged from their true scale with respect to the body.

A layer 18 of refractory metal, preferably an electronic grade molybdenum, is formed over the upper and side surfaces, 11 and 13, respectively, of body 14 to a thickness in the range of 0.1-3.0 microns. Layer 18 can be formed by sputtering from a molybdenum target.

A layer 20 of diamond is formed over the surface of molybdenum layer 18 to a thickness in the range of 0.5-4.0 microns, and preferably in the range of 1.0-2.0 microns. This preferred thickness range yields good performance at an acceptable cost. Diamond layer 20 can be formed using standard deposition techniques for pure and conformal diamond coatings. Such deposition processes include, for example, well known plasma and hot-filament diamond deposition methods.

A layer 22 of refractory metal, preferably electronic grade molybdenum, is deposited over diamond layer 20 to a thickness in the range of 0.1-2.0 microns. Molybdenum layer 22 is formed by sputtering from a molybdenum target.

Figure 2:
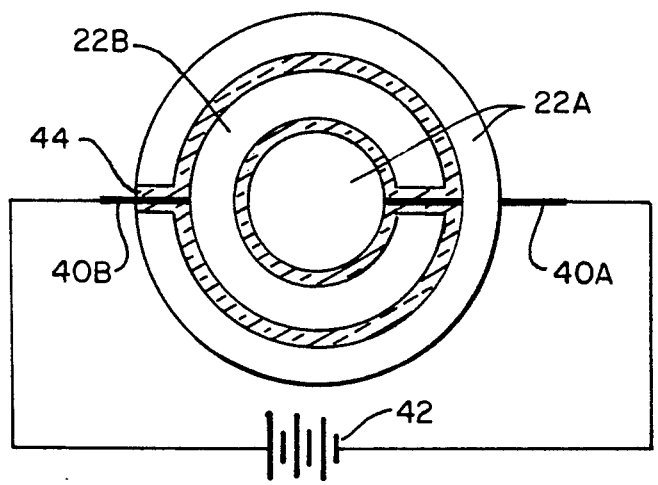
FIG. 2 is a plan view showing one configuration for the electrodes of the electostatic chuck of FIG. 1.
Figure 3:
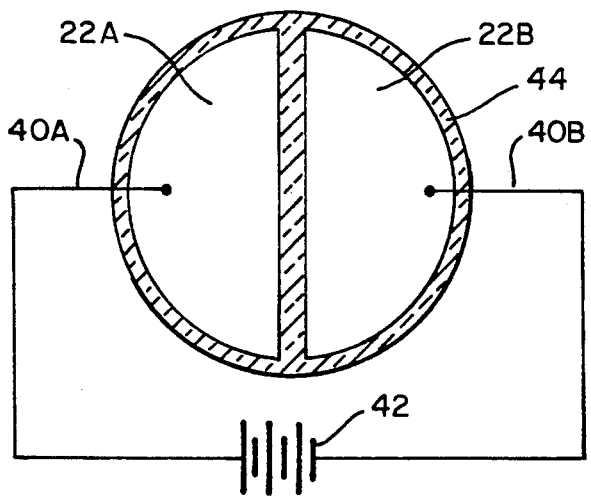
FIG. 3 is a plan view showing another configuration for the electrodes of the electrostatic chuck of FIG. 1.

Referring now to FIGS. 2 and 3, molybdenum layer 22 is patterned to define a pair of generally planar electrical conductors or electrodes 22A, 22B on layer 20 over upper surface 11 of body 14. Alternatively, electrodes 22A and 22B could be formed by depositing the molybdenum through a mask. It will be appreciated that FIGS. 2 and 3 illustrate but two of many such electrode configurations well known in the art. Electrical contacts 40A and 40B are provided to electrodes 22A, 22B, respectively, for subsequent connection across a source of dc potential 42.

Continuing to describe FIG. 1, a layer 44 of diamond is formed over molybdenum layer 22 to a thickness in the range of 0.5-4.0 microns, and preferably in the range of 1.0-2.0 microns. As with layer 20 above, this preferred thickness range yields an optimal cost/performance ratio. Diamond layer 44 is formed according to the same process as diamond layer 20, described hereinabove. Diamond layer 22 thus conformally covers electrodes 22A and 22B, as well as any regions of diamond layer 20 exposed between the electrodes.

Means for developing an electrostatic potential between chuck 10 and wafer 12 include a dc voltage source 42 connected between electrodes 40A and 40B. An rf source 46 is connected to body 14 for use as required in plasma environments. As is discussed in further detail below, an electrostatic force is developed for holding or supporting wafer 12 securely against the upper surface of diamond layer 44 by the application of a dc voltage potential between electrodes 40A and 40B.

In accordance with a more detailed process of forming electrostatic chuck 10:

1) molybdenum body 14 is machined almost to final dimensions;

2) molybdenum body 14 is then annealed at the higher of 50 degrees C. plus the highest expected operating temperature, or 650 degrees C.;

3) the machining of molybdenum body 14 is completed, and preferably includes the diamond polishing of top surface 11 and side surface 13;

4) a molybdenum preclean is done on body 14, for example by exposing the body to a reducing atmosphere of $H_2$ at an elevated temperature, and molybdenum layer 18 is sputter-deposited on top and side surfaces 11, 13, respectively, of the body;

5) a diamond preclean is completed on chuck 10 including layer 18, for example by sputter-cleaning, and diamond layer 20 is deposited over molybdenum layer 18;

6) the molybdenum preclean is completed, and electrodes 22A, 22b are formed over layer 20 in the manner described hereinabove;

7) electrodes 40A and 40B are masked (not shown) to prevent deposition of diamond, and another diamond preclean is performed on chuck 10 including layers 18, 20, and 22;

8) diamond layer 44 is formed over layer 22, and the masks are removed from over contacts 40A and 40B; and 9) electrical contact is then made in a conventional manner to dc source 42 and rf source 46.

To operate chuck 10, a voltage in the range of 10-1,000 V is applied via dc source 42 to electrodes 22A and 22B. An electrostatic force is thus developed between chuck 10 and wafer 12 for holding the wafer securely against diamond layer 44 over surface 11. The nature of this electrostatic force is discussed in further detail below.

When chuck 10 is operated in a plasma environment, an rf signal is applied to body 14 by source 46, with the plasma functioning as the second electrode. Chuck 10 could thus be formed as a unipole chuck, including only a single electrode 22, or using only body 14 as the chuck pole.

The present inventors have discovered an unexpected synergism in using diamond coatings (i.e. layers 20 and 44) with refractory metal components (i.e. body 14 and electrodes 22A, 22B).

Diamond is known to exhibit exceptional characteristics as a material for use in harsh environments. It is chemically inert and thus suitable for use in chemically harsh or corrosive environments. It is hard, resisting mechanical wear and damage. It has a high melting point and also a high thermal conductivity, making it suitable for use in high-temperature environments, and for removing or adding heat to the wafer surface so as to obtain precise temperature control. Diamond also has a very high resistivity (approximately $10^9$ ohms-cm), a high dielectric constant (i.e. approximately 5.4), and a high breakdown voltage (greater than $4 \times 10^6$ volts/cm), making it an exceptional insulator.

The present inventors have discovered that, when combined with refractory metal elements of the type described above, diamond has unexpected and exceptional operating characteristics in the formation of an electrostatic chuck, particularly when such a chuck is used in semiconductor manufacturing environments.

More specifically, the diamond coating makes the chuck particularly stable in the harsh etching, coating, and chemical processing environments in which such a chuck is typically used. Refractory metals exhibit high melting points which also make them suitable for high-temperature environments. Refractory metals, and particularly molybdenum, also exhibit almost the identical coefficient of thermal expansion as diamond, making chuck 10 particularly sturdy by inhibiting delamination of the layered materials typically used in prior art chucks. The present inventors have determined that chuck 10 is useful over an exceptionally wide range of temperatures; from cryogenic temperatures in the range of $-200°$ C., to processing temperatures in the range of $1,000°$ C.

Because of the particular durability between the diamond and refractory metal materials used in chuck 10, and because of the good insulating characteristics of diamond itself, diamond layers 20 and 44 can be utilized in the very thin ranges described above: i.e. in the range of 0.5–4.0 microns in thickness. Because such thin layers of diamond materials can be used, and because of the high dielectric constant exhibited by diamond, the present inventors have determined that an exceptionally strong electrostatic holding force can be developed at very low electrical potentials.

For example, using the equation:

$$\text{EQ1:} \quad F = \frac{K^2 \times V^2}{(d + Kb)^2} \times C$$

where:
F = holding force
K = dielectric constant
V = applied voltage
d = thickness of a dielectric
b = distance between electrostatic chuck and bottom of wafer
C = Constant, related to electrode area and permeability of free space, it can be determined that, in comparison to a prior art chuck where 2 mils of organic or inorganic insulator are typically used to insulate the upper layer of an electrostatic chuck, for the same V, C, and b=0, chuck 10 of the present invention will generate approximately 1565 times the holding force of a prior art chuck. Similarly, the same holding force can be obtained using approximately 2.5% of the applied voltage.

There is thus provided a new and improved electrostatic chuck mechanism formed from diamond-coated refractory metal. In comparison to the prior art, the chuck of the present invention provides the significant advantages of:

operability in a broad range of temperatures and in corrosive chemical environments, reduced dielectric (diamond) thickness while providing high holding force, good thermal conductivity, resistance to mechanical wear, and resistance to delamination, and reduced dc potential while providing high holding force, and low likelihood of arcing.

The present invention finds application in all wafer-type material handling environments, and particularly in the handling of semiconductor wafers in semiconductor device manufacturing environments.

While the invention has been shown and described with respect to preferred embodiments, it is not so limited. Numerous changes and improvements falling within the scope of the invention will occur to those skilled in the art.

What is claimed is:

1. An electrostatic chuck for supporting a wafer, comprising:
   a conductive body;
   a layer of diamond coating at least a portion of said conductive body; and
   means for developing an electrostatic force, including two electrodes supported on said body between said body and said layer of diamond coating to hold said wafer against said layer of diamond.

2. The electrostatic chuck of claim 1 wherein said conductive body comprises a refractory metal.

3. The electrostatic chuck of claim 1 wherein said means for developing an electrostatic force includes means for applying an electrical potential to said body.

4. An electrostatic chuck for supporting a wafer, comprising:
   a body of conductive material;
   a first layer of diamond coating at least a portion of said body;
   two electrodes disposed on said first layer of diamond; and
   a second layer of diamond over said two electrical conductors.

5. The electrostatic chuck of claim 4 wherein said two electrodes are generally planar.

6. The electrostatic chuck of claim 4 wherein said body of conductive material comprises a refractory metal.

7. The electrostatic chuck of claim 4 wherein each of said two electrodes comprises a refractory metal.

8. The electrostatic chuck of claim 4 wherein said first and second diamond layers each have a thickness in the range of 0.1–5.0 microns.

9. The electrostatic chuck of claim 8 wherein said first and second diamond layers each have a thickness in the range of 1.0–2.0 microns.

10. The electrostatic chuck of claim 4 and further including means for developing an electrostatic force for holding said wafer against said second layer of diamond.

11. The electrostatic chuck of claim 10 wherein said means for developing an electrostatic force includes means for applying an electric potential between said two electrodes.

12. An electrostatic chuck for supporting a wafer comprising:
   a body of refractory metal including at least one planar surface sized to support said wafer;
   a first layer of diamond coating at least said planar surface;
   at least two generally planar refractory metal electrical conductors disposed on said first layer of diamond; and
   a second layer of diamond coating said at least two electrical conductors.

13. The electrostatic chuck of claim 12 wherein said second layer of diamond is situated conformally to cover said at least two conductors and any regions of said first layer of diamond exposed between said two conductors.

14. The electrostatic chuck of claim 13 and further including means for developing an electrostatic force to support said wafer against said second layer of diamond.

15. The electrostatic chuck of claim 14 wherein said means for developing an electrostatic force includes means for applying a dc voltage potential between said at least two conductors.

16. The electrostatic chuck of claim 12 wherein each of said first and second layers of diamond are between 0.1 and 5.0 microns in thickness.

17. The electrostatic chuck of claim 16 wherein each of said first and second layers of diamond are between 1.0 and 2.0 microns in thickness.

18. The electrostatic chuck of claim 12 wherein said body and each of said at least two electrical conductors comprise molybdenum.

19. The electrostatic chuck of claim 12 and further including means for applying an rf signal to said body.

20. A method of forming an electrostatic chuck for supporting a wafer, comprising the steps of:
providing a conductive body;
forming a layer of diamond over at least a portion of said conductive body; and
developing an electrostatic force to hold said wafer against said layer of diamond, including the step of providing two electrical conductors supported on said body between said body and said layer of diamond.

21. The method of claim 19 wherein said conductive body comprises a refractory metal.

22. The method of claim 20 wherein said step of developing an electrostatic force includes applying an electrical potential between said two electrical conductors.

23. A method of manufacturing an electrostatic chuck for supporting a wafer, comprising:
providing a body of conductive material;
forming a first layer of diamond coating at least a portion of said body;
forming two generally planar electrical conductors on said first layer of diamond; and
forming a second layer of diamond over said two electrical conductors.

24. The method of claim 23 wherein said body of conductive material comprises a refractory metal.

25. The method of claim 23 wherein each of said two electrical conductors comprises a refractory metal.

26. The method of claim 23 wherein said first and second diamond layers each have a thickness in the range of 0.1–5.0 microns.

27. The method of claim 26 wherein said first and second diamond layers each have a thickness in the range of 1.0–2.0 microns.

28. The method of claim 23 and further including the step of developing an electrostatic force for holding said wafer against said second layer of diamond.

29. The method of a claim 28 wherein said step of developing an electrostatic force includes applying an electric potential between said two electrical conductors.

30. A method of fabricating an electrostatic chuck for supporting a wafer comprising the steps of:
providing a body of refractory metal including at least one planar surface sized to support said wafer;
forming a first layer of diamond over at least said planar surface;
forming at least two generally planar electrical conductors on said first layer of diamond; and
forming a second layer of diamond over said at least two electrical conductors.

31. The method of claim 30 wherein said second layer of diamond is situated conformally to cover said two electrical conductors and any regions of said first layer of diamond exposed between said two electrical conductors.

32. The method of claim 31 and further including the step of developing an electrostatic force to support said wafer against said second layer of diamond.

33. The method of claim 32 wherein said step of developing an electrostatic potential includes the step of applying a dc voltage potential between said first and second electrical conductors.

34. The method of claim 30 wherein each of said first and second layers of diamond are between 0.1 and 5.0 microns in thickness.

35. The method of claim 34 wherein each of said first and second layers of diamond are between 1 and 2 microns in thickness.

36. The method of claim 30 wherein said body and said layer of refractory metal each comprise molybdenum.

37. The method of claim 30 and further including the step of selectively applying an rf signal to said conductive body.

* * * * *